United States Patent
Wu et al.

(10) Patent No.: US 8,574,702 B2
(45) Date of Patent: Nov. 5, 2013

(54) SHELL STRUCTURE AND MANUFACTURING METHOD FOR SHELL STRUCTURE OF ELECTRONIC DEVICE

(75) Inventors: Jung-Chin Wu, Taipei (TW); Po-An Lin, Taipei (TW); Kuo-Nan Ling, Taipei (TW); Han-Ching Huang, Taipei (TW); Chih-Wen Chiang, Taipei (TW); Chien-Min Chang, Taipei (TW)

(73) Assignee: Compal Electronics, Inc., Taipei (TW)

( * ) Notice: Subject to any disclaimer, the term of this patent is extended or adjusted under 35 U.S.C. 154(b) by 0 days.

(21) Appl. No.: 13/332,398

(22) Filed: Dec. 21, 2011

(65) Prior Publication Data

US 2012/0164360 A1    Jun. 28, 2012

Related U.S. Application Data

(60) Provisional application No. 61/427,098, filed on Dec. 23, 2010.

(51) Int. Cl.
*B32B 3/12* (2006.01)

(52) U.S. Cl.
USPC .......................................... 428/116; 264/257

(58) Field of Classification Search
USPC .................................. 428/116, 35.6; 264/257
See application file for complete search history.

(56) References Cited

U.S. PATENT DOCUMENTS

| | | | |
|---|---|---|---|
| 6,021,564 A * | 2/2000 | Hanson | 29/852 |
| 8,173,247 B2 * | 5/2012 | Noordegraaf et al. | 428/213 |
| 2005/0271859 A1 * | 12/2005 | Tuss et al. | 428/113 |
| 2011/0070431 A1 * | 3/2011 | Noordegraaf et al. | 428/336 |
| 2011/0305869 A1 * | 12/2011 | Pollak et al. | 428/116 |
| 2012/0040135 A1 * | 2/2012 | Werthen et al. | 428/138 |

* cited by examiner

*Primary Examiner* — N. Edwards
(74) *Attorney, Agent, or Firm* — Jianq Chyun IP Office

(57) ABSTRACT

A shell structure includes a composite material layer and a second material layer is provided. The composite material layer includes a woven layer and a first material layer. The woven layer has a first surface and a second surface opposite to each other. The first material layer is located on the first surface and has a plurality of through-holes. The second material layer is disposed on the first material layer and has a plurality of extending-portions adapted to be combined with the woven layer and fix the second material layer and the composite material layer to each other. In addition, a manufacturing method for shell structure of electronic device is also provided.

30 Claims, 5 Drawing Sheets

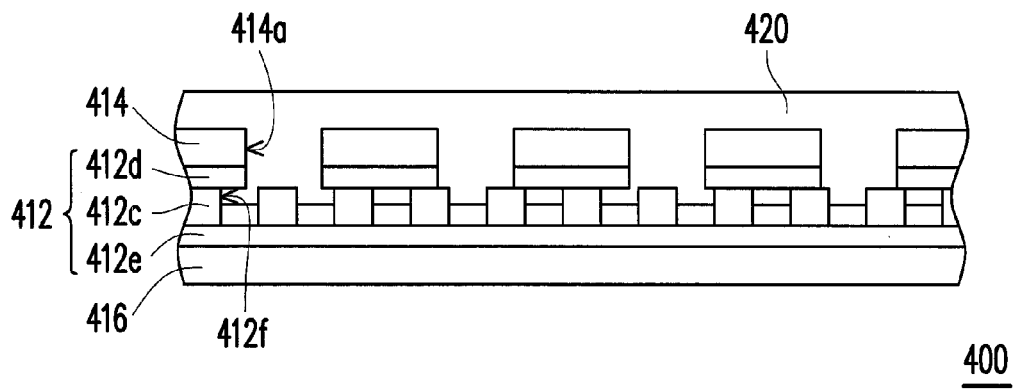

FIG. 6

```
Providing a composite material layer, which comprises a woven layer and a first
material layer, wherein the woven layer has a first surface and a second surface
opposite to each other and the first material layer is located on the first surface
and has a plurality of through-holes
```
— S702

```
Overlaying a plastic material at the surface of the first material layer and forming
a second material layer on the first material layer through a plasticizing process,
wherein the plastic material layer prior to the plasticizing can be in a fused state
and after the plasticizing it has a plurality of extending-portions respectively
extending into the through-holes to combine the woven layer through the
through-holes and make the second material layer and the composite material
layer fixed by each other
```
— S704

FIG. 7

SHELL STRUCTURE AND MANUFACTURING METHOD FOR SHELL STRUCTURE OF ELECTRONIC DEVICE

CROSS-REFERENCE TO RELATED APPLICATION

This application claims the priority benefits of U.S. provisional application Ser. No. 61/427,098, filed on Dec. 23, 2010. The entirety of the above-mentioned patent application is hereby incorporated by reference herein and made a part of this specification.

BACKGROUND OF THE INVENTION

1. Field of the Invention

The invention generally relates to a shell structure and a manufacturing method thereof, and more particularly, to a shell structure with a composite material layer and a manufacturing method thereof.

2. Description of Related Art

In recent years, functions of a portable electronic device become increasingly diversified, a volume becomes increasingly smaller. Further, with convenience of wireless communication and wireless network, people may obtain network information through the portable electronic device, so that the portable electronic device becomes increasingly popular. The portable electronic device is a working platform capable of being carried by people to anywhere, and stores a great amount of data and application programs. If a structure strength does not satisfy security protection standards, is not pressure proofing, and is not collision proofing, troublesome in carrying is resulted. In order to enhance the portability, the thickness and the weight of the portable electronic device are continuously reduced, but the lowering of the thickness and the weight collides with the maintaining of the structure strength in certain design features. Therefore, enhancing the structure strength of the portable electronic device and lowering the thickness and the weight of the entire structure are always key points in designing the portable electronic device.

A composite material formed by combining a light material, for example, mylar, graphite, bamboo fiber, or carbon fiber with a composite material has a good structure strength, and is light and thin, so as to be applied to a shell of an electronic device. When the composite material includes a high thermal conducting material, for example, the graphite, a position of a surface of the shell of the electronic device corresponding to a heat generating element may have higher temperature, so that a user may feel uncomfortable.

SUMMARY OF THE INVENTION

Accordingly, the invention is directed to a shell structure able to save manufacturing time and cost.

The invention is directed to a manufacturing method for shell structure of electronic device able to save manufacturing time and cost.

The invention provides a shell structure including a composite material layer and a second material layer. The composite material layer includes a woven layer and a first material layer. The woven layer has a first surface and a second surface opposite to each other. The first material layer is located on the first surface and has a plurality of through-holes. The second material layer is disposed on the first material layer and has a plurality of extending-portions adapted to be combined with the woven layer and fix the second material layer and the composite material layer to each other.

In an embodiment of the present invention, the above-mentioned woven layer includes a core layer and a first bonding layer. The first bonding layer is disposed between the core layer and the first material layer, wherein the extending-portions of the second material layer are combined with the first bonding layer by going through the through-holes.

In an embodiment of the present invention, the above-mentioned composite material layer further includes a third material layer and the woven layer further includes a second bonding layer, wherein the third material layer is glued on the second surface by the second bonding layer.

In an embodiment of the present invention, the material of the above-mentioned core layer includes polyester film (mylar), graphite, plant fiber or carbon fiber.

In an embodiment of the present invention, each of the above-mentioned extending-portions extends to the corresponding through-hole.

In an embodiment of the present invention, the above-mentioned core layer does not include opening.

In an embodiment of the present invention, the above-mentioned first bonding layer has a plurality of bump portions, the bump portions are respectively located in the through-holes, each of the bump portions fills a portion of the corresponding through-hole, and each of the extending-portions fills the rest portion of the corresponding through-hole and is combined with the corresponding bump portion.

In an embodiment of the present invention, the above-mentioned first bonding layer has a plurality of openings, the openings are respectively aligned to the through-holes, and each of the extending-portions is combined with the first bonding layer and the core layer through the corresponding through-hole and the corresponding opening.

In an embodiment of the present invention, the above-mentioned core layer includes a plurality of openings.

In an embodiment of the present invention, each of the above-mentioned extending-portions is combined with the first bonding layer and the second bonding layer by going through the through-holes and the openings to dispose the second material layer on a surface of the first material layer.

In an embodiment of the present invention, each of the above-mentioned extending-portions is combined with the second bonding layer or the first bonding layer by going through the through-holes and the openings to dispose the second material layer on a surface of the first material layer.

In an embodiment of the present invention, the above-mentioned core layer includes a honeycomb structure.

In an embodiment of the present invention, the above-mentioned first material layer and third material layer are metallic plates.

In an embodiment of the present invention, the material of the above-mentioned first material layer and third material layer is aluminium.

In an embodiment of the present invention, the above-mentioned second material layer is a plastic material layer and the plastic material layer is a frame.

In an embodiment of the present invention, the above-mentioned frame includes a plurality of protruded pillars.

In an embodiment of the present invention, the distribution area of the above-mentioned through-holes is aligned to the second material layer and is ring shape.

In an embodiment of the present invention, the above-mentioned second material layer is formed on a surface of the first material layer by an injection molding process.

The invention provides a manufacturing method for shell structure of electronic device. First, a composite material layer is provided. The composite material layer includes a woven layer and a first material layer, wherein the woven layer has a first surface and a second surface opposite to each other and the first material layer is located on the first surface and has a plurality of through-holes. Next, a plastic material is overlapped on a surface of the first material layer so as to form a plastic material layer on the first material layer by a plasticizing process, wherein the plasticized plastic material layer has a plurality of extending-portions adapted to be combined with the woven layer and fix the plastic material layer and the composite material layer to each other.

In an embodiment of the present invention, a portion of the above-mentioned plastic material flows into the through-holes and forms the extending-portions by the plasticizing process.

In an embodiment of the present invention, the above-mentioned woven layer includes a core layer and a first bonding layer, the first bonding layer is disposed between the core layer and the first material layer, and the step of forming the plastic material layer on the first material layer includes: combining the extending-portions with the first bonding layer through the through-holes.

In an embodiment of the present invention, the above-mentioned composite material layer further includes a second material layer and the woven layer further includes a second bonding layer, wherein the second bonding layer is located between the second material layer and the woven layer, and the second material layer is glued on the second surface by the second bonding layer.

In an embodiment of the present invention, the above-mentioned step of combining the extending-portions with the first bonding layer through the through-holes includes: extending each of the extending-portions to the corresponding through-hole and combining each of the extending-portions with the first bonding layer.

In an embodiment of the present invention, the above-mentioned core layer does not include opening.

In an embodiment of the present invention, the above-mentioned first bonding layer has a plurality of bump portions, the bump portions are respectively located in the through-holes, each of the bump portions fills a portion of the corresponding through-hole, and the step of combining the extending-portions with the first bonding layer through the through-hole includes: filling the rest portion of the corresponding through-hole by each of the extending-portions and combining each of the extending-portions with the corresponding bump portion.

In an embodiment of the present invention, the above-mentioned first bonding layer has a plurality of openings, the openings are respectively aligned to the through-holes, and the step of combining the extending-portions with the first bonding layer through the through-holes includes: combing each of the extending-portions with the first bonding layer and the core layer through the corresponding through-hole and the corresponding opening.

In an embodiment of the present invention, the above-mentioned core layer includes a plurality of openings.

In an embodiment of the present invention, the above-mentioned step of combining the extending-portions with the first bonding layer and the second bonding layer through the through-holes includes: combing each of the extending-portions with the first bonding layer and the second bonding layer through the through-holes and the openings to dispose the plastic material layer on a surface of the first material layer.

In an embodiment of the present invention, the above-mentioned step of combining the extending-portions with the first bonding layer or the second bonding layer through the through-holes includes: combing each of the extending-portions with the first bonding layer or the second bonding layer through the through-holes and the openings to dispose the plastic material layer on a surface of the first material layer.

In an embodiment of the present invention, the above-mentioned first material layer and third material layer are metallic plates and the material of the first material layer and the third material layer is aluminium.

Based on the description above, in the invention, the second material layer is disposed on the first material layer and the extending-portions of the second material layer are combined with the woven layer inside the composite material layer through the through-holes of the first material layer so as to firmly dispose the second material layer on the composite material layer. In this way, the second material layer can be combined with the first material layer without bonding process and the manufacturing time and cost are thereby saved.

Other objectives, features and advantages of the invention will be further understood from the further technological features disclosed by the embodiments of the invention wherein there are shown and described preferred embodiments of this invention, simply by way of illustration of modes best suited to carry out the invention.

BRIEF DESCRIPTION OF THE DRAWINGS

FIG. 6 is a partial cross-sectional diagram of a shell structure according to yet another embodiment of the invention.

FIG. 7 is a schematic flowchart of a manufacturing method for the shell structure of FIG. 1.

DESCRIPTION OF THE EMBODIMENTS

Figure 1:
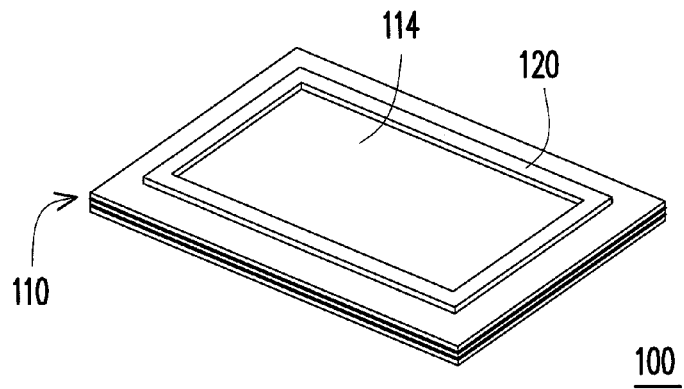
FIG. 1 is a schematic three-dimensional diagram of a shell structure according to an embodiment of the invention.
Figure 2:
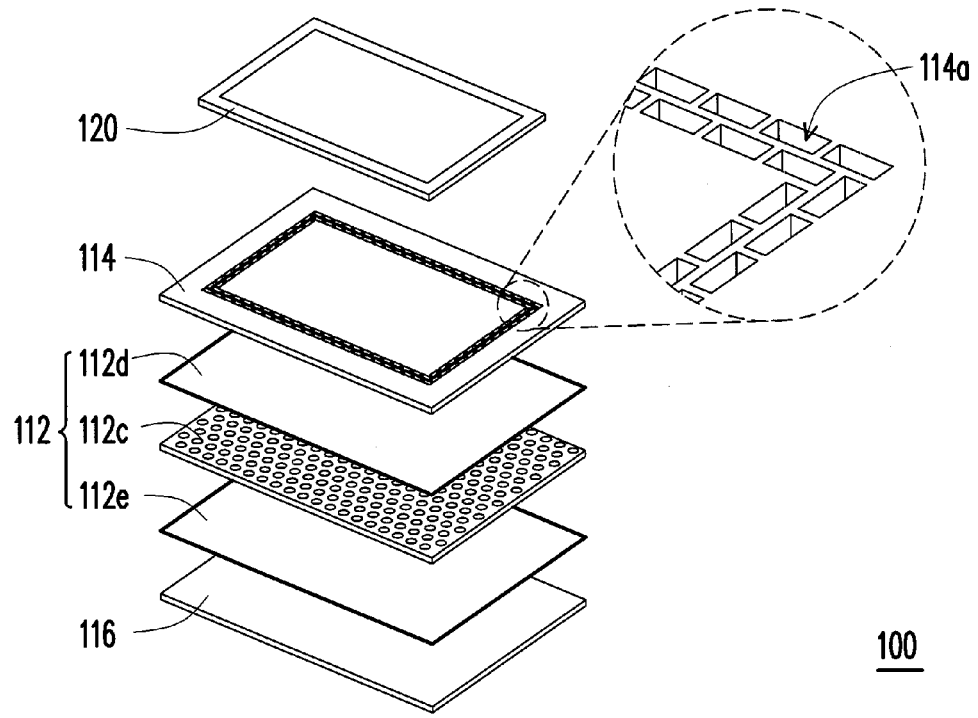
FIG. 2 is an exploded diagram of the shell structure of FIG. 1.
Figure 3A:
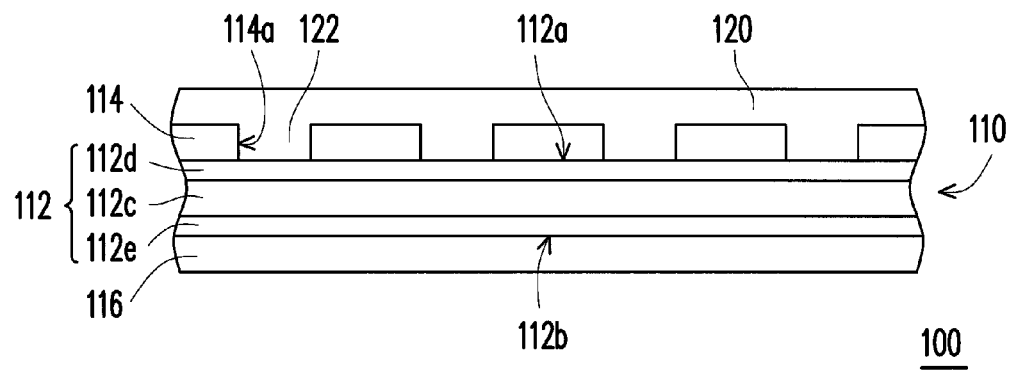
FIG. 3A is a partial cross-sectional diagram of the shell structure of FIG. 1.

FIG. 1 is a schematic three-dimensional diagram of a shell structure according to an embodiment of the invention, FIG. 2 is an exploded diagram of the shell structure of FIG. 1 and FIG. 3A is a partial cross-sectional diagram of the shell structure of FIG. 1. Referring to FIGS. 1-3A, a shell structure 100 of the embodiment is, for example, a casing used in an electronic device and includes a composite material layer 110 and a second material layer 120, wherein the second material layer 120 is a plastic material layer. The composite material layer 110 includes a woven layer 112, a first material layer 114 and a third material layer 116. Depending on different product designs, the composite material layer 110 can includes the woven layer 112 and the first material layer 114 only. Both the first material layer 114 and the third material layer 116 are a metallic layer. The woven layer 112 includes a first surface 112a and a second surface 112b opposite to each other. The first material layer 114 is glued on the first surface 112a and has a plurality of through-holes 114a. The through-holes 114a expose the first surface 112a. The third material layer 116 is glued on the second surface 112b. The second material layer 120 is disposed on the third material layer 116 and has a plurality of extending-portions 122. The extending-portions 122 respectively extend into the through-holes 114a to be combined with the woven layer 112 through the through-holes 114a and make the second material layer 120 and the composite material layer 110 fixed by each other. Under the above-mentioned layout, by combining the extending-portions 122 of the second material layer 120 with the woven layer 112 through the through-holes 114a, the second material layer 120 can be firmly disposed on the composite material layer 110. The second material layer 120 herein thereby does not need a bonding process to be combined with the first material layer 114, which is advantageous in saving manufacturing time and cost.

The second material layer 120 in the embodiment is formed on the first material layer 114 by an injection molding process. During the process, a fused plastic material prior to be frozen would flow into the through-holes 114a and, after a plasticizing process, the extending-portions 122 are formed. The plasticizing process herein can be implemented by a heating or a cooling process according to the different materials of the plastic material, which does not affect the scope of the invention. In addition, in the embodiment, each of the through-holes 114a of the first material layer 114 is formed by, for example, a punching process or a cutting process. Each of the through-holes 114a is, for example, a 2 mm×1 mm rectangular hole, and the interval between the adjacent through-holes 114a is, for example, 2 mm. In other embodiments, the through-holes 114a can be formed by other appropriate methods and the through-hole 114a can have other appropriate dimensions, shapes and intervals, which the invention is not limited to.

In more details, the woven layer 112 of the embodiment includes a core layer 112c, a first bonding layer 112d and a second bonding layer 112e. The first bonding layer 112d is disposed between the core layer 112c and the first material layer 114 for combining the core layer 112c with the first material layer 114. The second bonding layer 112e is disposed between the core layer 112c and the third material layer 116 for combining the core layer 112c with the third material layer 116. The extending-portions 122 of the second material layer 120 are combined with the first bonding layer 112d through the through-holes 114a. In other words, in addition to bonding the first material layer 114 onto the woven layer 112, the first bonding layer 112d further serves as a combining interface between the second material layer 120 and the first material layer 114, so that the third material layer 116 can be combined with the composite material layer 110. When the composite material layer includes the woven layer 112 and the first material layer 114 only, the woven layer 112 only includes the core layer 112c and the first bonding layer 112d, wherein the first bonding layer 112d is located between the core layer 112c and the first material layer 114 for bonding the first material layer 114 onto the core layer 112c. Depending on different product designs, when the composite material layer includes the woven layer 112 and the first material layer 114 only, the core layer 112c inside the woven layer 112 usually does not include opening. When the composite material layer includes the woven layer 112, the first material layer 114 and the third material layer 116 however, the core layer 112c inside the woven layer 112 usually includes a plurality of openings, which does not limit the scope of the invention.

In the embodiment, the first material layer 114 and the second material layer 116 are metallic plates made of aluminum. The material of the core layer 112c is, for example, a lightweight material such as polyester film (mylar), graphite, plant fiber or carbon fiber so as to make the integrated structure lighter. In other embodiments, the first material layer 114, the second material layer 116 and the core layer 112c can be other appropriate materials, which the invention is not limited to. In addition, the core layer 112c is, for example, a honeycomb structure to further reduce the weight, which the invention is not limited to. In other embodiments, the core layer 112c can be other appropriate structures.

As shown by FIG. 2, the second material layer 120 of the embodiment is, for example, a frame, and the distribution area of the through-holes 114a is aligned to the second material layer 120 and is ring shape. The frame has a plurality of protruded pillars (not shown) disposed thereon and used for fixing other components on the shell structure 100. The invention does not limit the shape of the second material layer 120 and the distribution area of the through-holes 114a. In other embodiments, the second material layer 120 can have other shapes and the through-holes 114a can have other appropriate distribution areas.

Referring FIG. 3A again, in the embodiment, when the composite material layer 112 includes the woven layer 112, the first material layer 114 and the third material layer 116, and the core layer 112c does not include opening, each of the extending-portions 122 extends into the corresponding through-hole 114a and is glued onto the first bonding layer 112d. The extending-portions 122 herein can fill up the corresponding through-holes 114a to be glued onto the first bonding layer 112d. When the first bonding layer 112d is thicker and combined with the first material layer 114, the overflowing is more serious and occurs at the first bonding layer 112d from the through-holes 114a up, which makes the third material layer 116 unable to fill up the through-holes when the first bonding layer 112d is exposed at another surface of the first material layer 114. Instead, at the time, the third material layer 116 and the first bonding layer 112d on a surface of the first material layer 114 are directly glued with each other. The invention does not limit the form of the extending-portions 122, and more explanations are described through figures in following.

Figure 3B:
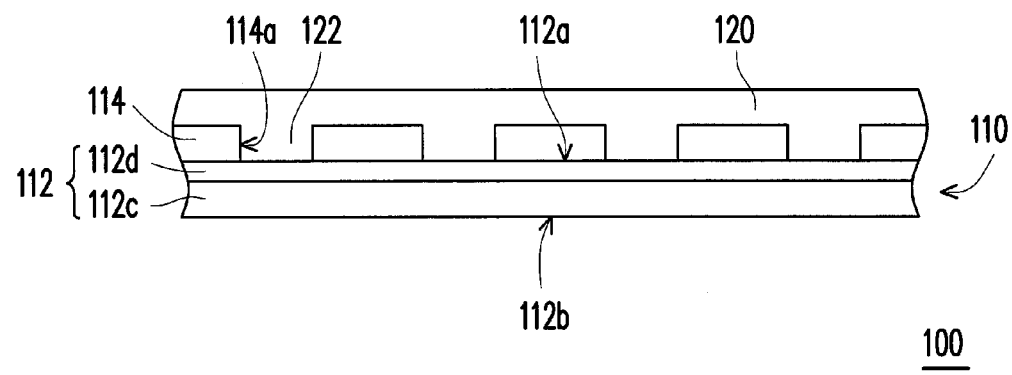
FIG. 3B is a partial cross-sectional diagram of a shell structure according to another embodiment of the invention.

FIG. 3B is a partial cross-sectional diagram of a shell structure according to another embodiment of the invention. Referring to FIG. 3B, in the embodiment, when the composite material layer 112 includes the woven layer 112 and the first material layer 114, and the core layer 112c does not include opening, each of the extending-portions 122 extends into the corresponding through-hole 114a and is glued onto the first bonding layer 112d. The extending-portions 122 herein can fill up the corresponding through-holes 114a to be glued onto the first bonding layer 112d. When the first bonding layer 112d is thicker and combined with the first material layer 114, the overflowing is more serious and occurs at the first bonding layer 112d from the through-holes 114a up, which makes the third material layer 116 unable to fill up the through-holes when the first bonding layer 112d is exposed at another surface of the first material layer 114. Instead, at the time, the third material layer 116 and the first bonding layer 112d on a surface of the first material layer 114 are directly glued with each other. The invention does not limit the form of the extending-portions 122, and more explanations are described through figures in following.

Figure 4:
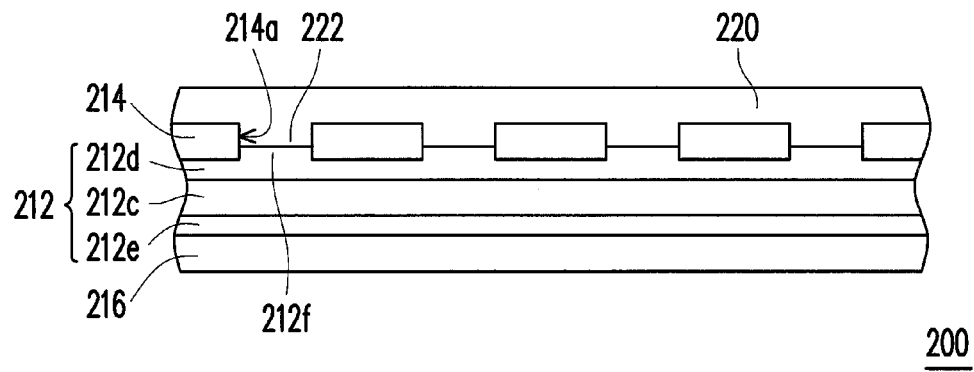
FIG. 4 is a partial cross-sectional diagram of a shell structure according to yet another embodiment of the invention.

FIG. 4 is a partial cross-sectional diagram of a shell structure according to yet another embodiment of the invention. Referring to FIG. 4, in a shell structure 200 of the embodiment, the layout for a third material layer 216, a core layer 212c of a woven layer 212 and a second bonding layer 212e of the woven layer 212 is the same as the layout of FIG. 3 (omitted to describe) except the difference of the shell structure 200 from the shell structure 100 of FIG. 3. A first bonding layer 212d in the shell structure 200 has a plurality of bump portions 212f, which are respectively located in the through-holes 214a of a first material layer 214. Each of the bump portions 212f fills a portion of the corresponding through-hole 214a. The extending-portions 222 of a second material layer 220 respectively fill the rest portion of the corresponding through-hole 214a and is glued at the corresponding bump portion 212f.

Figure 5:
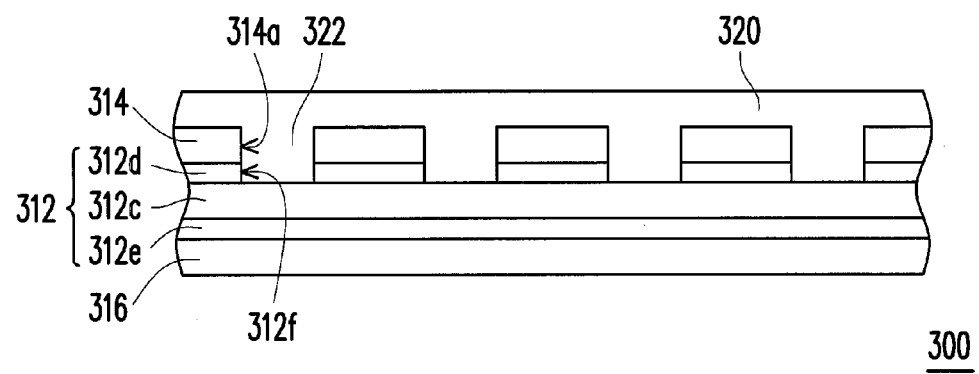
FIG. 5 is a partial cross-sectional diagram of a shell structure according to yet another embodiment of the invention.

FIG. 5 is a partial cross-sectional diagram of a shell structure according to yet another embodiment of the invention. Referring to FIG. 5, in a shell structure 300 of the embodiment, the layout for a third material layer 316, a core layer 312c of a woven layer 312 and a second bonding layer 312e of the woven layer 312 is the same as the layout of FIG. 3 (omitted to describe) except the difference of the shell structure 300 from the shell structure 100 of FIG. 3. A first bonding layer 312d has a plurality of openings 312f, which are respectively located at and corresponding to the through-holes 314a of a first material layer 314 and expose the core layer 312c. Each of the extending-portions 322 of a second material layer 320 is glued at the first bonding layer 312d and combined with the core layer 312 through the corresponding through-hole 314a and opening 312f.

FIG. 6 is a partial cross-sectional diagram of a shell structure according to yet another embodiment of the invention. Referring to FIG. 6, in a shell structure 400 of the embodiment, the layout for a third material layer 416 and a second bonding layer 412e of a woven layer 412 is the same as the layout of FIG. 3 (omitted to describe) except the difference of the shell structure 400 from the shell structure 100 of FIG. 3. A core layer 412c of a woven layer 412 has a plurality of openings to reduce the weight of the shell structure. Depending on the different product designs, the openings 412f on a core layer 412c can be aligned to or not aligned to the through-holes 414a on a first material layer 414, which however does not limit the scope of the invention. Prior to conducting a plasticizing process of a second material layer 420, due to the capillarity, the openings 412f of the core layer 412c can contain a first bonding layer 412d. When conducting the process of the second material layer 420, a fused plastic material is combined with the first bonding layer 412d by going through the through-holes 414a and the openings 412f on the core layer 412c. When only the openings of the partial core layer contain the first bonding layer 412d, during conducting the process to form the second material layer 420, the fused plastic material is combined with the first bonding layer 412d and a second bonding layer 412e by going through the through-holes 414a and the openings 412f on the core layer 412c (not shown). When the openings of the core layer do not contain the first bonding layer 412d therein, during conducting the process to form the second material layer 420, the fused plastic material is combined with the second bonding layer 412e by going through the through-holes 414a and the openings 412f on the core layer 412c (not shown). Depending on the different process parameters, the fused plastic material can be combined with the core layer 412c by going through the through-holes 414a and the openings 412f on the core layer 412c, which however does not limit the scope of the invention.

In following, a manufacturing method for shell structure of the invention is described by taking the shell structure 100 of FIG. 3B as an example. FIG. 7 is a schematic flowchart of a manufacturing method for the shell structure of FIG. 1. Referring to FIG. 7, first, a composite material layer 110 shown by FIG. 3B is provided, wherein the composite material layer 110 includes a woven layer 112 and a first material layer 114. The woven layer 112 has a first surface 112a and a second surface 112b opposite to each other. The first material layer 114 is located on the first surface 112a and has a plurality of through-holes 114a (step S702). Next, a plastic material is overlaid on a surface of the first material layer and a plasticizing process is conducted to form a second material layer 120 on the first material layer 114 as shown by FIG. 3B. The plastic material prior to the plasticizing herein can be in a fused state and the second material layer 120 after the plasticizing has a plurality of extending-portions 122. The extending-portions 122 respectively extend into the through-holes 114a to be combined with the woven layer 112 through the through-holes 114a and make the second material layer 120 and the composite material layer 110 fixed by each other (step S704). The plasticizing process can be a heating process or a cooling process depending on the different plastic material, but it does not affect the scope of the invention.

Figure 8A:
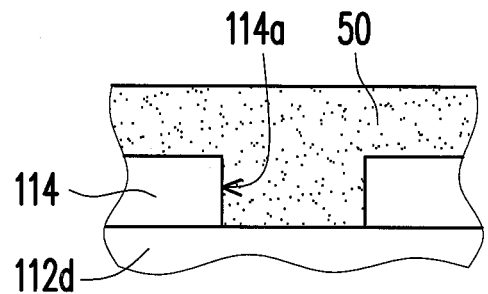
FIGS. 8A and 8B are diagrams showing the steps of the manufacturing method for the shell structure of FIG. 1.
Figure 8B:
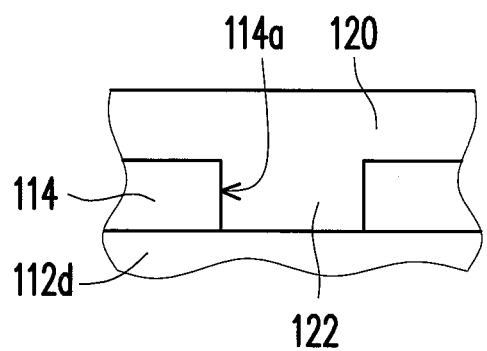

FIGS. 8A and 8B are diagrams showing the steps of the manufacturing method for the shell structure of FIG. 1. In the above-mentioned step S704, for example, an injection molding process is used as shown by FIG. 8A to make a fused plastic material 50 overlay the first material layer 114 and the partial fused plastic material 50 flows into the through-holes 114a so as to conduct a plasticizing process. At the time, the fused plastic material 50 is frozen to become a plastic material layer. As shown by FIG. 8B, during forming the second material layer 120, the extending-portions 122 are formed as well. The extending-portions 122 extend into the through-holes 114a and are glued at the first bonding layer 112d through the through-holes 114a, wherein the extending-portions 122 can fill up the through-holes 114a so as to be glued with the first bonding layer 112d. The plasticizing process can be implemented by a heating process or a cooling process depending on the different plastic materials, but it does not affect the scope of the invention. In other embodiments, the partial through-holes 114a can be filled by a plurality of bump portions 212f of the first bonding layer 212d as shown by FIG. 4, where the rest portion of the through-holes 114a is filled by the extending-portions 222 and the extending-portions 222 are glued at the bump portions 212f. In addition, the extending-portions 322 can be glued at the first bonding layer 312d through the through-holes 314a and the openings 312f of the first bonding layer 312d and combined with the core layer 312c as shown by FIG. 5. Even it can be conducted as shown by FIG. 6, the extending-portions 322 are glued at the first bonding layer 312d through the through-holes 414a and the multiple openings 412f on the core layer and combined with the core layer 412c.

In summary, in the invention, the second material layer is disposed on the first material layer and the extending-portions of the second material layer are combined with the first bonding layer through the through-holes of the first material layer and the first bonding layer inside the composite material layer so as to firmly dispose the second material layer on the composite material layer. In this way, the second material layer can be combined with the first material layer without bonding process and the manufacturing time and cost are thereby saved.

It will be apparent to those skilled in the art that the descriptions above are several preferred embodiments of the invention only, which does not limit the implementing range of the invention. Various modifications and variations can be made to the structure of the invention without departing from the scope or spirit of the invention. The claim scope of the invention is defined by the claims hereinafter.

What is claimed is:
1. A shell structure, comprising:
    a composite material layer, comprising:

a first layer comprising a core layer and a first bonding layer, having a first surface and a second surface opposite to each other;

a first material layer, located on the first surface and having a plurality of through-holes; and a second material layer, disposed on the first material layer and having a plurality of extending-portions adapted to be combined with the first layer and fix the second material layer and the composite material layer to each other.

2. The shell structure as claimed in claim 1, wherein the first bonding layer of the first layer is disposed between the core layer and the first material layer, wherein the extending-portions of the second material layer are combined with the first bonding layer through the through-holes.

3. The shell structure as claimed in claim 2, wherein the composite material layer further comprises a third material layer and the first layer further comprises a second bonding layer, wherein the third material layer is glued on the second surface by the second bonding layer.

4. The shell structure as claimed in claim 2, wherein the material of the core layer comprises polyester film (mylar), graphite, plant fiber or carbon fiber.

5. The shell structure as claimed in claim 2, wherein each of the extending-portions extends to the corresponding through-hole.

6. The shell structure as claimed in claim 2, wherein the core layer does not comprise an opening.

7. The shell structure as claimed in claim 6, wherein the first bonding layer has a plurality of bump portions, the bump portions are respectively located in the through-holes, each of the bump portions fills a portion of the corresponding through-hole, and each of the extending-portions fills the rest portion of the corresponding through-hole and is combined with the corresponding bump portion.

8. The shell structure as claimed in claim 6, wherein the first bonding layer has a plurality of openings, the openings are respectively aligned to the through-holes, and each of the extending-portions is combined with the first bonding layer and the core layer through the corresponding through-hole and the corresponding opening.

9. The shell structure as claimed in claim 3, wherein the core layer comprises a plurality of openings.

10. The shell structure as claimed in claim 9, wherein each of the extending-portions is combined with the first bonding layer and the second bonding layer by going through the through-holes and the openings to dispose the second material layer on a surface of the first material layer.

11. The shell structure as claimed in claim 9, wherein each of the extending-portions is combined with the second bonding layer or the first bonding layer by going through the through-holes and the openings to dispose the second material layer on a surface of the first material layer.

12. The shell structure as claimed in claim 9, wherein the core layer comprises a honeycomb structure.

13. The shell structure as claimed in claim 3, wherein the first material layer and the third material layer are metallic plates.

14. The shell structure as claimed in claim 3, wherein the material of the first material layer and the third material layer is aluminium.

15. The shell structure as claimed in claim 1, wherein the second material layer is a plastic material layer and the plastic material layer is a frame.

16. The shell structure as claimed in claim 15, wherein the frame comprises a plurality of protruded pillars.

17. The shell structure as claimed in claim 15, wherein the distribution area of the through-holes is aligned to the second material layer and is ring shape.

18. The shell structure as claimed in claim 1, wherein the second material layer is formed on a surface of the first material layer by an injection molding process.

19. A manufacturing method for shell structure of electronic device, comprising:

providing a composite material layer, the composite material layer comprises a first material layer and a first layer comprising a core layer and a first bonding layer, wherein the first layer has a first surface and a second surface opposite to each other and the first material layer is located on the first surface and has a plurality of through-holes; and overlaying a plastic material on a surface of the first material layer and forming a plastic material layer on the first material layer by a plasticizing process, wherein the plasticized plastic material layer has a plurality of extending-portions adapted to be combined with the first layer and fix the plastic material layer and the composite material layer to each other.

20. The manufacturing method for shell structure of electronic device as claimed in claim 19, wherein a portion of the plastic material flows into the through-holes and forms the extending-portions by the plasticizing process.

21. The manufacturing method for shell structure of electronic device as claimed in claim 19, wherein the first bonding layer of the first layer is disposed between the core layer and the first material layer, and the step of forming the plastic material layer on the first material layer comprises:

combining the extending-portions with the first bonding layer through the through-holes.

22. The manufacturing method for shell structure of electronic device as claimed in claim 21, wherein the composite material layer further comprises a second material layer and the first layer further comprises a second bonding layer, wherein the second bonding layer is located between the second material layer and the first layer, and the second material layer is glued on the second surface by the second bonding layer.

23. The manufacturing method for shell structure of electronic device as claimed in claim 21, wherein the step of combining the extending-portions with the first bonding layer through the through-holes comprises:

extending each of the extending-portions to the corresponding through-hole and combining each of the extending-portions with the first bonding layer.

24. The manufacturing method for shell structure of electronic device as claimed in claim 21, wherein the core layer does not comprise opening.

25. The manufacturing method for shell structure of electronic device as claimed in claim 24, wherein the first bonding layer has a plurality of bump portions, the bump portions are respectively located in the through-holes, each of the bump portions fills a portion of the corresponding through-hole, and the step of combining the extending-portions with the first bonding layer through the through-hole comprises:

filling the rest portion of the corresponding through-hole by each of the extending-portions and combining each of the extending-portions with the corresponding bump portion.

26. The manufacturing method for shell structure of electronic device as claimed in claim 24, wherein the first bonding layer has a plurality of openings, the openings are respectively aligned to the through-holes, and the step of combining the extending-portions with the first bonding layer through the through-holes comprises:
    combing each of the extending-portions with the first bonding layer and the core layer through the corresponding through-hole and the corresponding opening.

27. The manufacturing method for shell structure of electronic device as claimed in claim 22, wherein the core layer comprises a plurality of openings.

28. The manufacturing method for shell structure of electronic device as claimed in claim 22, wherein the step of combining the extending-portions with the first bonding layer and the second bonding layer through the through-holes comprises:
    combing each of the extending-portions with the first bonding layer and the second bonding layer through the through-holes and the openings to dispose the plastic material layer on a surface of the first material layer.

29. The manufacturing method for shell structure of electronic device as claimed in claim 22, wherein the step of combining the extending-portions with the first bonding layer or the second bonding layer through the through-holes comprises:
    combing each of the extending-portions with the first bonding layer or the second bonding layer through the through-holes and the openings to dispose the plastic material layer on a surface of the first material layer.

30. The manufacturing method for shell structure of electronic device as claimed in claim 22, wherein the first material layer and the third material layer are metallic plates and the material of the first material layer and the third material layer is aluminium.

\* \* \* \* \*